(12) United States Patent
Her et al.

(10) Patent No.: US 11,567,247 B2
(45) Date of Patent: Jan. 31, 2023

(54) PLASMA ETCHING METHOD USING FARADAY CAGE

(71) Applicant: LG CHEM, LTD., Seoul (KR)

(72) Inventors: Eun Kyu Her, Daejeon (KR); Jeong Ho Park, Daejeon (KR); Seong Min Park, Daejeon (KR); Sang Choll Han, Daejeon (KR); Bu Gon Shin, Daejeon (KR)

(73) Assignee: LG CHEM, LTD., Seoul (KR)

( * ) Notice: Subject to any disclaimer, the term of this patent is extended or adjusted under 35 U.S.C. 154(b) by 47 days.

(21) Appl. No.: 17/267,462

(22) PCT Filed: Nov. 4, 2019

(86) PCT No.: PCT/KR2019/014784
§ 371 (c)(1),
(2) Date: Feb. 9, 2021

(87) PCT Pub. No.: WO2020/096291
PCT Pub. Date: May 14, 2020

(65) Prior Publication Data
US 2021/0311229 A1    Oct. 7, 2021

(30) Foreign Application Priority Data
Nov. 9, 2018    (KR) .................. 10-2018-0137547

(51) Int. Cl.
*H01L 21/3065*    (2006.01)
*G02B 5/18*    (2006.01)
*B29C 33/38*    (2006.01)
*B29D 11/00*    (2006.01)

(52) U.S. Cl.
CPC ........ *G02B 5/1857* (2013.01); *B29C 33/3842* (2013.01); *B29D 11/00769* (2013.01)

(58) Field of Classification Search
CPC ..................... H01L 21/3065; G02B 5/1857
See application file for complete search history.

(56) References Cited

U.S. PATENT DOCUMENTS

| | | | |
|---|---|---|---|
| 6,960,413 B2 * | 11/2005 | Brooks | ..................... G03F 1/50 430/311 |
| 9,139,914 B2 | 9/2015 | Kim et al. | |
| 9,607,853 B2 | 3/2017 | Jeon et al. | |
| 2009/0124089 A1 * | 5/2009 | Brencher | .......... H01L 21/76802 156/345.1 |

(Continued)

FOREIGN PATENT DOCUMENTS

| KR | 10-1994-0007150 A | 4/1994 |
|---|---|---|
| KR | 10-0281241 B1 | 6/2001 |

(Continued)

OTHER PUBLICATIONS

Lee, Seung Haeng, "Multi-directional plasma etching using a Faraday Case", Master's thesis, Dept. of Chemical and Biological Engineering, The Graduate School of Seoul National University, Feb. 2008, pp. 1-49.

(Continued)

*Primary Examiner* — Thomas T Pham
(74) *Attorney, Agent, or Firm* — Dentons US LLP

(57) ABSTRACT

A plasma etching method using a Faraday cage, which effectively produces a blazed grating pattern.

11 Claims, 8 Drawing Sheets

(56) References Cited

U.S. PATENT DOCUMENTS

| | | | | |
|---|---|---|---|---|
| 2012/0009512 A1* | 1/2012 | Jang | ....................... | B82Y 40/00 |
| | | | | 430/5 |
| 2014/0367687 A1* | 12/2014 | Loncar | ................ | H01L 21/3065 |
| | | | | 257/77 |
| 2015/0303226 A1* | 10/2015 | Kurihara | ........... | H01L 27/14643 |
| | | | | 257/432 |
| 2016/0351495 A1* | 12/2016 | Paolillo | ............... | H01L 23/5226 |

FOREIGN PATENT DOCUMENTS

| | | |
|---|---|---|
| KR | 10-0479893 B1 | 6/2005 |
| KR | 2008-004711 A | 1/2008 |
| KR | 10-1002089 B1 | 12/2010 |
| KR | 10-1019756 B1 | 3/2011 |
| KR | 10-2015-0015130 A | 2/2015 |
| KR | 10-2016-0006029 A | 1/2016 |
| WO | 2013-147966 A2 | 10/2013 |

OTHER PUBLICATIONS

Jang et al: "Angular Dependence of the Etch Rates of TaN in CF4/A4 and CHF3/Ar Plasmas," Journal of the Electrochemical Society, vol. 155, No. 9, Sep. 2008, pp. D614-D617, XP002803732.

* cited by examiner

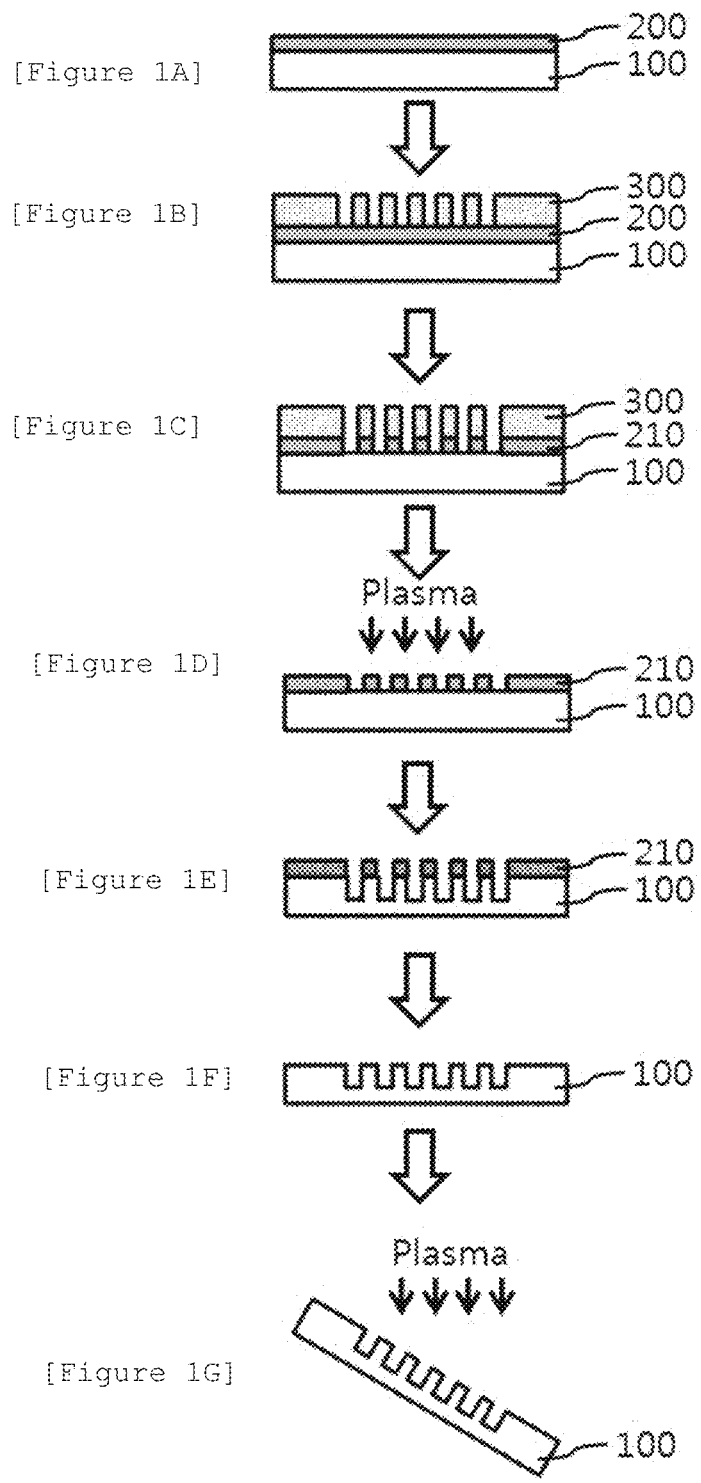

[Figure 2]
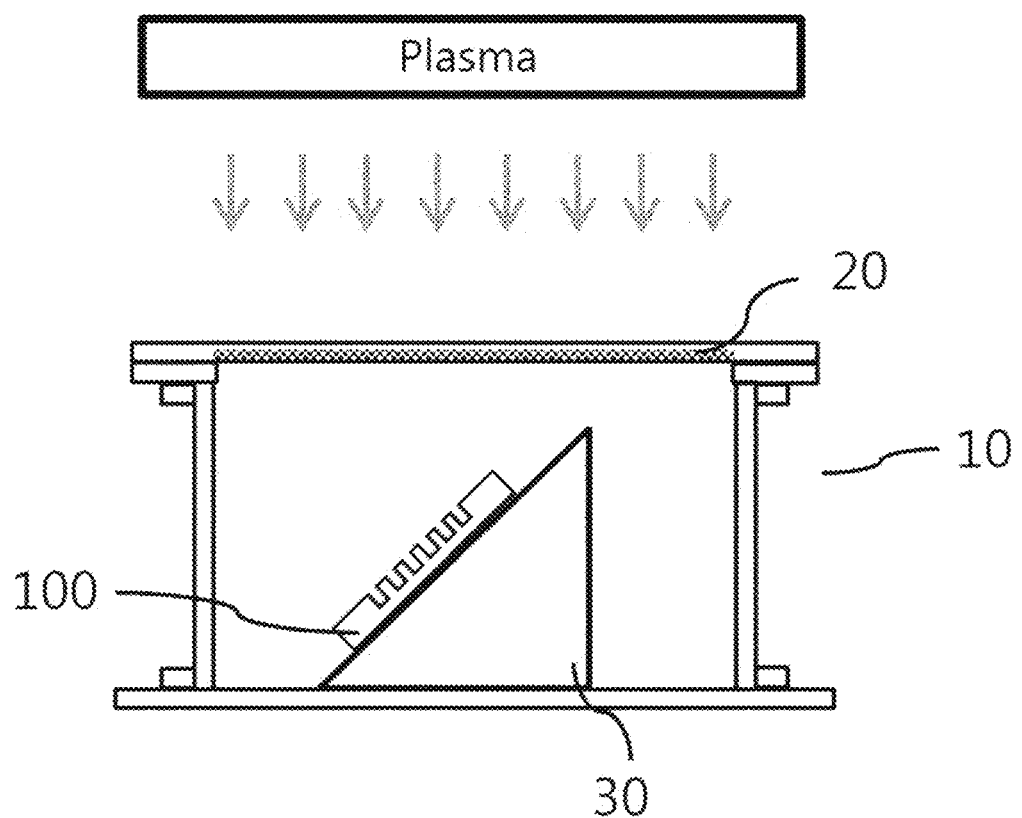

[Figure 3]
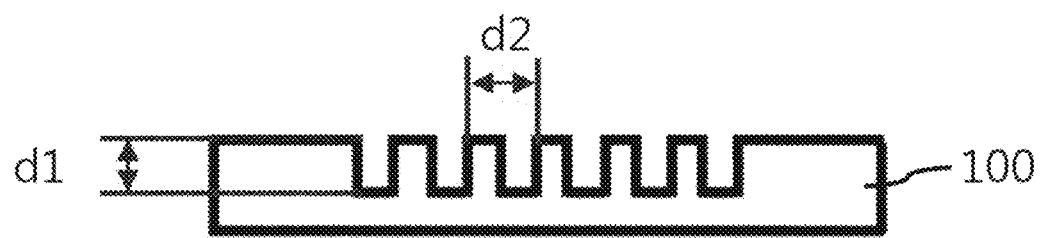

[Figure 4]
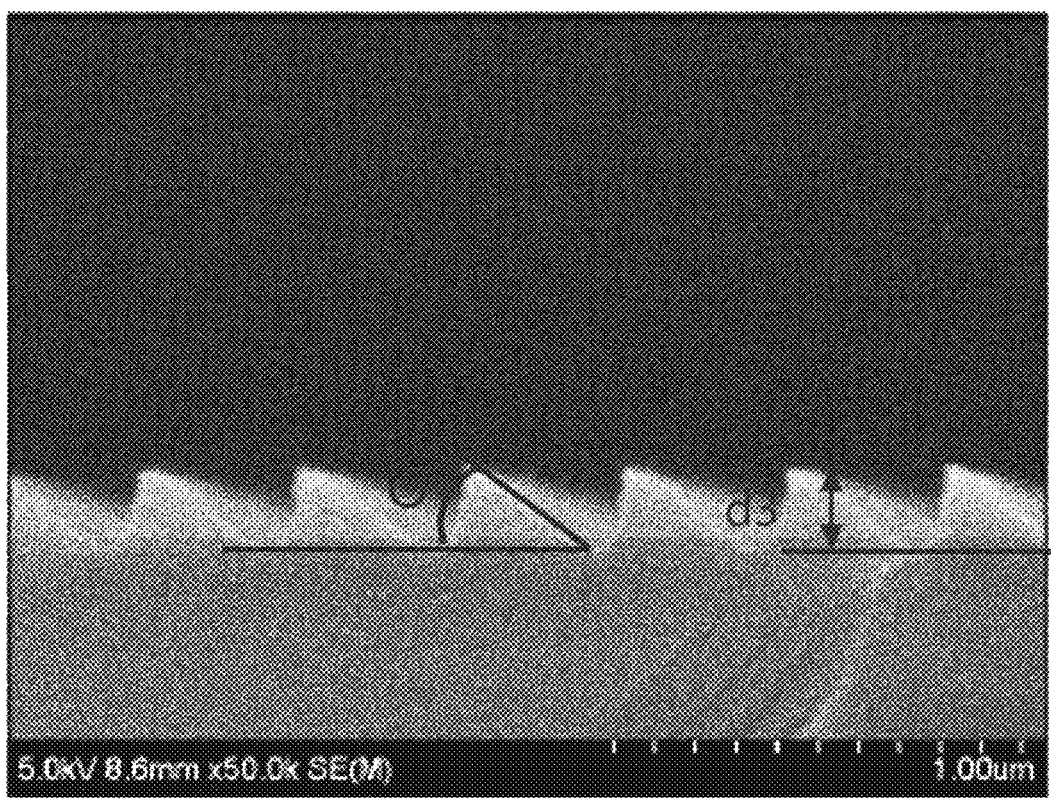

[Figure 5]
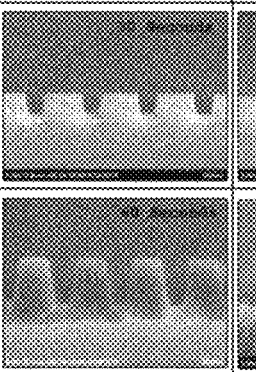

[Figure 6]

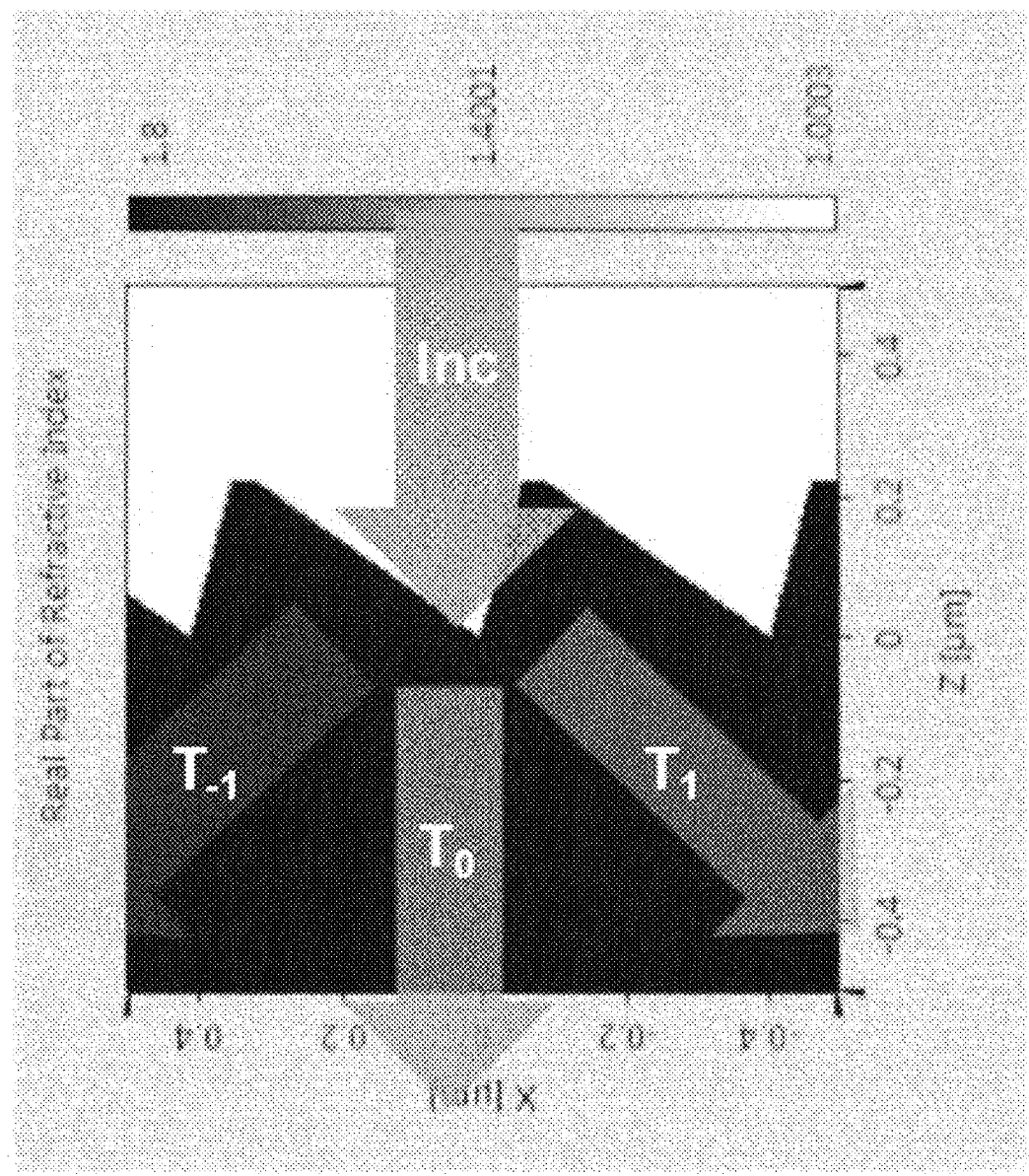
[Figure 7]

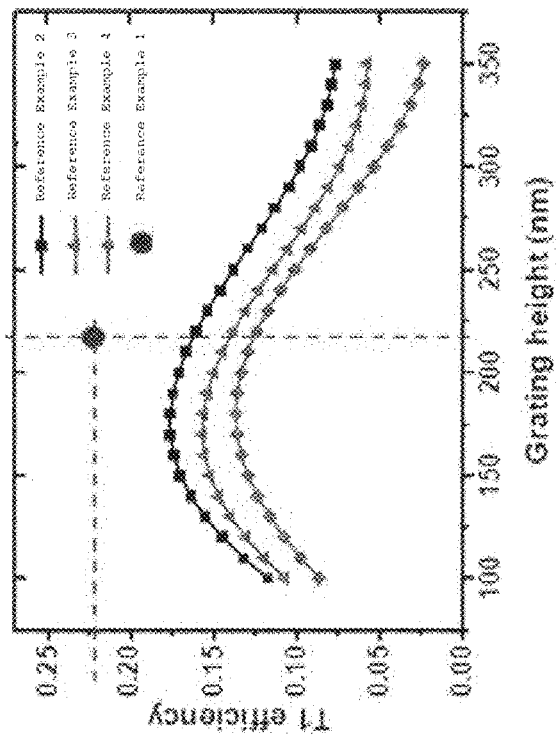
[Figure 8B]
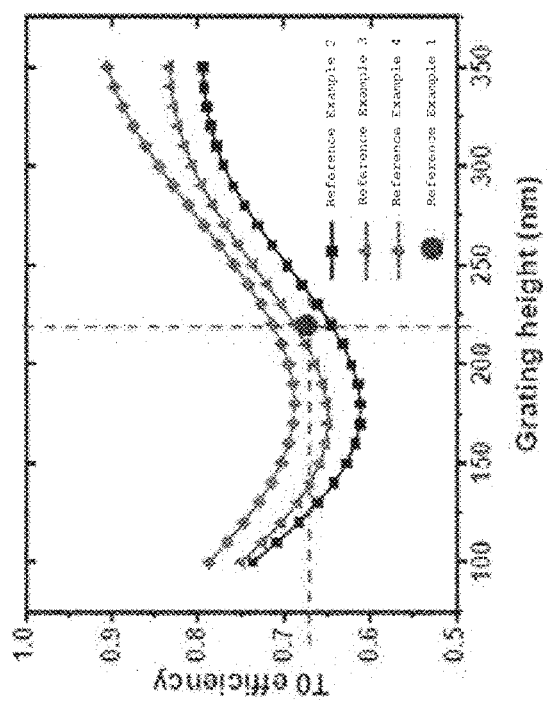
[Figure 8A]

PLASMA ETCHING METHOD USING FARADAY CAGE

CROSS-REFERENCE TO RELATED APPLICATIONS

The present application is a U.S. national stage of international Application No. PCT/KR2019/014784 filed on Nov. 4, 2019, and claims the benefit of Korean Patent Application No. 10-2018-0137547 filed with the Korean Intellectual Property Office on Nov. 9, 2018, the entire contents of which are incorporated herein.

TECHNICAL FIELD

The present invention relates to a plasma etching method using a Faraday cage.

BACKGROUND

Conventional methods for forming a blazed grating pattern on a substrate include a method of forming a groove having a specific shape on the surface of a substrate by direct machining and a method of forming a linear sawtooth grating on a substrate having a photoresist pattern formed thereon by using an ion beam etching system.

However, it is difficult to form a pattern having a precise structure using the method of forming the pattern by machining, and it is difficult to form a blazed grating pattern having a desired shape at a specific position on the substrate using the method of forming the pattern using ion beam etching.

Meanwhile, there is also a method of replicating a pattern using a mold provided with a blazed grating pattern. However, it is difficult for a user to produce a pattern by controlling a desired position and shape using a mold provided with a predetermined pattern.

Therefore, there is a need for a technique capable of easily forming a blazed grating pattern on a substrate.

SUMMARY

The present invention is directed to a plasma etching method using a Faraday cage, which is capable of effectively producing a blazed grating pattern.

However, problems to be solved by the present invention are not limited to the above-mentioned problems, and other problems which are not mentioned will be clearly understood by those skilled in the art from the following description.

An exemplary embodiment of the present invention provides a plasma etching method using a Faraday cage, the method including the steps of: forming, on one surface of a substrate, a metal mask including a pattern exposing a portion of the one surface of the substrate; performing a first plasma etching on the one surface of the substrate to form a first pattern on a portion of the one surface of the substrate, which has been exposed through the metal mask; and removing the metal mask from the one surface of the substrate, placing the one surface of the substrate in a Faraday cage having a mesh portion at the top thereof in such a manner that the one surface of the substrate is inclined with respect to the bottom of the Faraday cage, and performing a second plasma etching to form the first pattern portion into a second pattern portion having a blazed shape.

The plasma etching method using a Faraday cage according to an exemplary embodiment of the present invention is capable of easily producing a blazed grating pattern on a substrate.

The effects of the present invention are not limited to the above-described effects, and effects which are not mentioned will be clearly understood by those skilled in the art from the present specification and the accompanying drawings.

BRIEF DESCRIPTION OF DRAWINGS

FIGS. 1A to 1G are schematic illustrations of a plasma etching method using a Faraday cage according to an exemplary embodiment of the present invention.

FIG. 2 is an illustration of a step of forming a second pattern portion according to an exemplary embodiment of the present invention.

FIG. 3 is an illustration of a substrate to be etched having a first pattern portion according to an exemplary embodiment of the present invention.

FIG. 4 is a scanning electron micrograph of a section of a substrate having a second pattern portion produced by the plasma etching method using a Faraday cage according to an exemplary embodiment of the present invention.

FIG. 5 are scanning electron micrographs of various sections of substrates, each including a second pattern portion, produced in Examples 1 and 2 of the present invention.

FIG. 6 are scanning electron micrographs of various sections of substrates, each including a second pattern portion, produced in Comparative Examples 1 to 3.

FIG. 7 is a schematic illustration of the movement of light incident on the pattern portion of each of the substrates of Reference Examples 1 to 4 of the present invention.

FIGS. 8A and 8B are graphical representations of the light diffraction efficiencies, calculated using a Fourier modal method, for the substrates of Reference Examples 1 to 4 of the present invention.

DETAILED DESCRIPTION

Throughout the present specification, it is to be understood that when any part is referred to as "including" any component, it does not exclude other components, but may further include other components, unless otherwise specified.

Throughout the present specification, when any member is referred to as being "on" another member, it refers to not only a case where any member is in contact with another member, but also a case where a third member exists between the two members.

As used throughout the present specification, the term "step of doing . . . " or "step of . . . " does not mean "a step for . . . "

The Faraday cage in the present invention means a closed space made of a conductor. If the Faraday cage is placed in plasma, a sheath will be formed on the outer surface of the cage and the electric field inside the cage will be maintained at a constant state. At this time, when the top of the Faraday cage is formed of a mesh portion, the sheath is formed along the surface of the mesh portion. Therefore, when plasma etching using the Faraday cage is performed, ions accelerated in a direction perpendicular to the sheath formed horizontally on the surface of the mesh portion enter the Faraday cage, reach a substrate while maintaining the direction at the time of the entry and etch the substrate. Furthermore, the surface of the mold substrate in the Faraday cage in the present invention may be fixed to be horizontal or inclined with respect to the mesh surface, and since the ions enter in a direction perpendicular to the mesh surface, etching in a direction perpendicular to or inclined with respect to the surface of the mold substrate is possible. The Faraday cage may be an electrically conductive cage whose top is composed of a mesh portion having electrical conductivity. The etching direction of the plasma etching may be a direction perpendicular to the surface of the mesh portion of the Faraday cage.

In the case of plasma etching using the Faraday cage, ions that pass through the mesh portion collide with neutral particles present in the Faraday cage while moving toward the substrate and lose their kinetic energy. Accordingly, the density of the ions tends to be inversely proportional to the distance from the mesh portion. That is, the ions show a higher etching rate when the ions are closer to the mesh portion on which they are incident, and the ions show a lower etching rate when the ions move away from the mesh portion.

The present inventors have studied a plasma etching method using the Faraday cage having the above-described characteristics, and have studied a method capable of easily forming a blazed grating pattern on a substrate using the Faraday cage, thereby achieving the invention described below.

Hereinafter, the present specification will be described in detail.

An exemplary embodiment of the present invention provides a plasma etching method using a Faraday cage, the method including the steps of: forming, on one surface of a substrate to be etched, a metal mask including a pattern exposing a portion of the one surface of the substrate to be etched; performing first plasma etching on the one surface of the substrate to be etched to form a first pattern portion on the portion of the one surface of the substrate to be etched, which has been exposed through the metal mask; and removing the metal mask from the one surface of the substrate to be etched, placing the one surface of the substrate to be etched in a Faraday cage having a mesh portion at the top thereof in such a manner that the one surface of the substrate to be etched is inclined with respect to the bottom of the Faraday cage, and performing second plasma etching to form the first pattern portion into a second pattern portion having a blazed shape.

The plasma etching method using a Faraday cage according to an exemplary embodiment of the present invention is capable of easily producing a pattern portion having a blazed shape on a substrate.

FIGS. 1A to 1G illustrate a plasma etching method using a Faraday cage according to an exemplary embodiment of the present invention. Specifically, FIG. 1A illustrates a step of forming a metal layer 200 on a surface of a substrate 100, and FIG. 1B illustrates a step of forming a photoresist layer 300 on the metal layer 200 and selectively developing a portion of the photoresist layer 300 by UV irradiation. Moreover, FIG. 1C illustrates a step of etching a portion of the metal layer 200, exposed through the photoresist layer 300, to form a metal mask 210 including a pattern exposing a portion of the surface of the substrate 100. Furthermore, FIGS. 1D and 1E illustrate a step of removing the photoresist layer 300, and then performing a first plasma etching to form a first pattern portion on the surface of the substrate 100 exposed through the metal mask 210. In addition, FIGS. 1F and 1G illustrate a step of removing the metal mask 200, and then performing a second plasma etching using the Faraday cage on the first pattern portion formed on the one surface of the substrate 100 for etching.

According to an exemplary embodiment of the present invention, the substrate to be etched may be a quartz substrate or a silicon wafer. In an etching process using a plasma etching system, specifically an inductively coupled plasma-reactive ion etching (ICP-RIE) system, the second blazed grating pattern may be more easily formed by using a quartz substrate or a silicon wafer as the substrate to be etched.

According to an exemplary embodiment of the present invention, a metal mask including a pattern may be formed on one surface of the substrate using a known apparatus and/or a method. Referring to FIGS. 1A to 1G, a metal may be deposited on a surface of the substrate to form a metal layer, and a photoresist layer may be spin-coated on the metal layer. Thereafter, the photoresist layer may be developed by UV irradiation to expose a portion of the metal layer, and the exposed portion of the metal layer may be etched to form a metal mask.

According to an exemplary embodiment of the present invention, the metal mask may include at least one of aluminum and chromium. Specifically, the metal mask may be made of aluminum.

According to an exemplary embodiment of the present invention, a portion of the surface of the substrate to be etched exposed through the pattern of the metal mask may be plasma-etched. That is, the pattern of the metal mask may correspond to the shape of the first pattern portion.

In addition, the thickness of the metal mask may be 30 nm to 100 nm. Specifically, the thickness of the metal mask may be 35 nm to 95 nm, 40 nm to 90 nm, 45 nm to 85 nm, or 50 nm to 80 nm. When the thickness of the metal mask is within the above-described ranges, it is possible to ensure a sufficient depth of the first pattern portion by using the metal mask during plasma etching and prevent the etching efficiency of the first pattern portion from decreasing. In addition, when the thickness of the metal mask is within the above-described ranges, it is possible to easily remove the metal mask without performing an excessive process.

According to an exemplary embodiment of the present invention, the first plasma etching may be performed using a helicon plasma method, a helical resonance plasma method, or an electron resonance plasma method. More specifically, the first plasma etching may be performed using an inductively coupled plasma-reactive ion etching (ICP-RIE) system. In addition, the plasma etching process may be performed using the Faraday cage provided in the inductively coupled plasma-reactive ion etching (ICP-RIE) system.

According to an exemplary embodiment of the present invention, in the step of forming the first pattern portion, the first plasma etching may be performed on the surface of the substrate to be etched, which has the metal mask provided thereon, to form a first pattern portion having a parallel surface on a portion of the surface of the substrate to be etched exposed through the metal mask.

FIG. 2 illustrates a step of forming a second pattern portion according to an exemplary embodiment of the present invention. As illustrated in FIG. 2, in the step of forming the second pattern portion, the substrate 100, from which the metal mask has been removed, may be placed on an inclined support 30 provided in a Faraday cage 10. Thereafter, second plasma etching may be performed to form a second blazed grating pattern on the surface of the substrate 100 for etching.

According to an exemplary embodiment of the present invention, the second plasma etching may also be performed using a helicon plasma method, a helical resonance plasma method, or an electron resonance plasma method, but the method for the second plasma etching is not limited thereto. Specifically, the second plasma etching may be performed using an inductively coupled plasma-reactive ion etching (ICP-RIE) system. More specifically, the plasma etching process may be performed using the Faraday cage provided in the inductively coupled plasma-reactive ion etching (ICP-RIE) system.

According to an exemplary embodiment of the present invention, in the step of forming the second pattern portion, the metal mask is removed from the surface of the substrate having the first pattern formed thereon, and then the second plasma etching is performed. If the second plasma etching is performed without removing the metal mask from the surface of the substrate to be etched, the upper portion of the first pattern will not be etched due to the influence of the metal mask, and hence the second blazed grating pattern may not be formed.

According to an exemplary embodiment of the present invention, the mesh portion may form a sheath by attracting free electrons from the surface coming in contact with plasma during plasma etching. In addition, the mesh portion may have electrical conductivity, and thus attract and accelerate positively charged ions. Furthermore, the mesh portion may be provided flat on a surface of the Faraday cage, and if there is a bent portion thereon, the etching rate in the bent portion may locally change.

According to an exemplary embodiment of the present invention, the mesh portion may have a sheet resistance of 0.5 Ω/sq or higher. Specifically, the sheet resistance of the mesh portion may be 0.5 Ω/sq to 100 Ω/sq. According to an exemplary embodiment of the present invention, when the sheet resistance of the mesh portion is within the above-described range, a high-etching region and a low-etching region may be consistently formed in the Faraday cage during plasma etching. That is, the second blazed grating pattern portion having a blazed grating pattern may be more easily formed from the first pattern via the second plasma etching. In addition, when the sheet resistance of the mesh portion is within the above-described range, the plasma etching efficiency may be increased while the production cost of the Faraday cage is reduced.

According to an exemplary embodiment of the present invention, the mesh portion may have a fluorocarbon radical adsorbed on a metal mesh. Specifically, the fluorocarbon radical may be —CF, —CF$_2$, —CF$_3$, or —C$_2$F$_x$ (x is an integer ranging from 1 to 5). More specifically, the fluorocarbon radical may be adsorbed on the mesh portion of the Faraday cage by etching with an F radical and surface polymerization during plasma etching. In addition, as the fluorocarbon radical is adsorbed on an electrically conductive material, such as a metal, the mesh portion may have a sheet resistance within the above-described range.

According to an exemplary embodiment of the present invention, a mesh made of stainless steel may be used as the mesh portion. Specifically, #200 commercial mesh (pitch: 125 μm, wire diameter: 50 μm, and aperture ratio: 36%) made of SUS304 may be used. However, the material of the mesh portion is not limited, and the mesh portion may be made of Al, Cu, W, Ni, Fe, or an alloy including at least two of these metals. In addition, the porosity and grid size of the mesh may be freely controlled according to the purpose of the etching.

According to an exemplary embodiment of the present invention, the distance between the substrate to be etched and the mesh portion may be 7 mm to 40 mm. Specifically, the distance between the substrate to be etched and the mesh portion may be 7 mm to 38 mm, 8 mm to 35 mm, 9 mm to 30 mm, 10 mm to 25 mm, 5 mm to 45 mm, or 3 mm to 50 mm. When the distance between the substrate to be etched and the mesh portion is within the above-described range, the etching rate and etching efficiency of the second plasma etching may be prevented from decreasing. In addition, when the distance between the substrate to be etched and the mesh portion is within the above-described range, the mesh grid pattern of the mesh portion acts like an etching mask, which may suppress an unwanted pattern from being formed on the substrate to be etched.

According to an exemplary embodiment of the present invention, the shape of the second pattern may be controlled by controlling at least one of the depth of the first pattern and the time for performing the second plasma etching. Specifically, the end portion of the second pattern may have a sharp shape or a round shape by adjusting at least one of the depth of the first pattern and the time for performing the second plasma etching. In addition, the depth of the second pattern and the degree of inclination of the second pattern portion may be adjusted.

Thus, the plasma etching method using a Faraday cage according to an exemplary embodiment of the present invention has advantages in that, through a simple method of adjusting the depth of the first pattern and the time for performing the second plasma etching, the shape of the second pattern may be variously adjusted, and the second pattern may be easily formed.

According to an exemplary embodiment of the present invention, the depth of the first pattern may be controlled by adjusting the time for performing the first plasma etching. Specifically, the depth of the first pattern may be increased by increasing the time for performing the first plasma etching.

FIG. 3 is a schematic illustration of the substrate to be etched having the first pattern according to an exemplary embodiment of the present invention. As illustrated in FIG. 3, a first pattern having a flat vertical end may be provided on a surface of the substrate to be etched. Specifically, as illustrated in FIG. 3, the first pattern on a surface of the substrate 100 has a depth of d1 and a pitch of d2. In the present invention, the "pitch" means the interval in which the pattern structures of the pattern pare repeated. As illustrated in FIG. 3, the pitch may mean a length between one point of one pattern structure and one point of another pattern structure adjacent thereto. One point of one pattern structure and one point of another pattern structure adjacent thereto may mean positions corresponding to each other between the pattern structures.

According to an exemplary embodiment of the present invention, the depth of the first pattern may be 50 nm to 350 nm. Specifically, the depth of the first pattern may be 75 nm to 340 nm, 100 nm to 335 nm, 120 nm to 340 nm, or 130 nm to 340 nm. When the depth of the first pattern is controlled within the above-described range, the second pattern having a blazed grating may be more easily formed. Specifically, when the depth of the first pattern is within the above-described range, the blazed grating of the second pattern may be more precisely formed by preventing interference between the pattern structures of the first pattern during the second plasma etching. In addition, when the depth of the first pattern is within the above-described range, the etching efficiency and degree of precision of the second plasma etching may be improved.

According to an exemplary embodiment of the present invention, the pitch of the first pattern may be 300 nm to 500 nm. Specifically, the pitch of the first pattern may be 325 nm to 475 nm, 350 nm to 450 nm, 375 nm to 425 nm, or 400 nm to 425 nm. When the pitch of the first pattern is within the above-described range, it is possible to prevent interference between the pattern structures of the first pattern during the second plasma etching, thereby forming the second pattern having a predetermined shape.

According to an exemplary embodiment of the present invention, the time for performing the second plasma etching may be 30 seconds to 180 seconds and the etching rate may be 30 nm/min or more. Specifically, the time for performing the second plasma etching may be 35 seconds to 190 second, 40 seconds to 200 seconds, or 45 seconds to 210 seconds, and the etching rate may be 30 nm/min or more and less than 100 nm/min. When the time for performing the second plasma etching is within the above-described range, the blazed grating of the second pattern may be more precisely formed. In addition, the second pattern may be formed within a relatively short time, and thus the efficiency of the etching process may be improved. In addition, the time for performing the second plasma etching may be controlled according to the depth of the first pattern.

According to an exemplary embodiment of the present invention, the step of forming the second pattern may include controlling the angle between the surface of the substrate to be etched and the bottom of the Faraday cage to an angle of 30° to 60°. Specifically, the angle between the surface of the substrate to be etched and the bottom of the Faraday cage during the second plasma etching may be 32.5° to 57.5°, 35° to 55°, 37.5° to 52.5°, 40° to 50°, or 20° to 70°.

When the angle between the surface of the substrate to be etched and the bottom of the Faraday cage in the step of forming the second pattern is within the above-described range, the degree of etching precision of the first pattern may be improved. Specifically, when the angle between a surface of the substrate to be etched and the bottom of the Faraday cage is within the above-described range, interference between the pattern structures of the first pattern during the second plasma etching may be prevented, and thus the blazed grating of the second pattern portion may be precisely formed.

FIG. 4 is a scanning electron micrograph showing a section of the substrate having the second pattern produced by the plasma etching method using a Faraday cage according to an exemplary embodiment of the present invention. Specifically, FIG. 4 shows that the second pattern on the surface of the substrate has a depth of d3 and the second pattern has an oblique inclination angle of Θ with respect to the substrate.

According to an exemplary embodiment of the present invention, the depth of the second pattern may be 100 nm to 300 nm. Specifically, as shown in FIG. 4, the depth (d3) of the second pattern may be 150 nm to 250 nm, or 180 nm to 210 nm. In addition, the oblique inclination angle of the second pattern with respect to the substrate may be 30° to 45°. Specifically, as shown in FIG. 4, the oblique inclination angle of the second pattern with respect to the substrate may be 35° to 40°. When the substrate including the second pattern having a depth and an oblique inclination angle within the above-described ranges is used as a mold substrate for a diffraction grating light guide plate, a diffraction grating light guide plate having excellent light diffraction efficiency may be easily produced. Furthermore, when a diffraction grating light guide plate is produced again using the diffraction grating light guide plate as an intermediate mold in a diffraction grating light guide plate production method to be described below, the release yield of the produced diffraction grating light guide plate and the intermediate mold may be improved.

According to an exemplary embodiment of the present invention, the first plasma etching and the second plasma etching may include controlling the output of the plasma etching system to 0.75 kW to 4 kW. Specifically, the output of the plasma etching system may be controlled to 0.75 kW to 3 kW, 0.75 kW to 1.5 kW, or 0.75 kW to 1 kW. When the output of the plasma etching system is controlled within the above-described range, it is possible to more precisely form the first pattern and the second pattern on the surface of the substrate. In addition, when the output of the plasma etching system is within the above-described range, it is possible to suppress a needle-like structure from being formed during etching of the substrate, thereby improving the degree of etching precision and etching efficiency of each of the first pattern and the second pattern.

According to an exemplary embodiment of the present invention, the plasma etching may include supplying a mixed gas including a reactive gas and an oxygen gas to the plasma etching system at a flow rate of 10 sccm to 100 sccm. Specifically, the mixed gas may be supplied to the plasma etching system at a flow rate of 15 sccm to 90 sccm, 25 sccm to 80 sccm, 30 sccm to 70 sccm, 40 sccm to 60 sccm, or 45 sccm to 55 sccm. When the flow rate of the mixed gas is controlled within the above-described range, it is possible to stably form the first pattern and the second pattern on a surface of the substrate.

According to an exemplary embodiment of the present invention, a normal reactive gas that is used in plasma etching may be used as the reactive gas. For example, a gas selected from among $SF_6$, $CHF_3$, $C_4F_8$, $CF_4$ and $Cl_2$ may be used.

According to an exemplary embodiment of the present invention, the content of the oxygen gas in the total flow rate of the mixed gas may be 1% to 20%. Specifically, the content of the oxygen gas in the total flow rate of the mixed gas may be 1% to 15%, 1% to 10%, or 1% to 5%. When the content of the oxygen gas in the total flow rate of the mixed gas is within the above-described range, it is possible to further suppress a needle-like structure from being formed during etching of the mold substrate, thereby more precisely forming the first pattern and the second pattern.

According to an exemplary embodiment of the present invention, the substrate having the second pattern may be a mold substrate for a diffraction grating light guide plate. Specifically, the second pattern formed on the substrate may be the pattern of a mold for a diffraction grating light guide plate.

Another exemplary embodiment of the present invention provides a method for producing a diffraction grating light guide plate, including the steps of: preparing a diffraction grating light guide plate mold, which has a second pattern formed thereon, by the plasma etching method using a Faraday cage; applying a resin composition to a surface of the diffraction grating light guide plate mold, on which the second pattern is formed; and curing the resin composition.

According to an exemplary embodiment of the present invention, as the resin composition, any resin composition may be used without limitation as long as it is generally used in the art. Furthermore, the step of applying the resin composition may be performed using a coating method that is generally used in the art, such as spin coating, dip coating, or drop casting. In addition, as a method for curing the resin composition, a curing method that is generally used in the art may be used without limitation. For example, when a photocurable resin composition is used, a photocuring method may be used, and when a thermosetting resin composition is used, a heat curing method may be used.

According to an exemplary embodiment of the present invention, the diffraction grating light guide plate may be used directly as a diffraction grating light guide plate. In addition, using the diffraction grating light guide plate as an intermediate mold, a final product may also be produced by a method of replicating the diffraction grating light guide plate. Specifically, when a diffraction grating light guide plate is produced again using the produced diffraction grating light guide plate as an intermediate mold, it is possible to obtain a diffraction grating light guide plate in which the inclination of the grating pattern of the diffraction grating light guide plate used as the intermediate mold is inverted. Furthermore, when a diffraction grating light guide plate mold is produced using, as an intermediate mold, the diffraction grating light guide plate whose inclination of the grating pattern is inverted, and then a diffraction grating light guide plate is produced, a grating pattern in the same direction as the first diffraction grating light guide plate may be obtained. In addition, when a diffraction grating light guide plate is produced again using the diffraction grating light guide plate as an intermediate mold, the release yield of the produced diffraction grating light guide plate and the intermediate mold may be improved.

According to an exemplary embodiment of the present invention, a protective film may be further provided on a surface of the substrate to be etched, from which the photoresist layer has been removed. The protective film may include a base layer and an adhesive layer. As the base layer of the protective film, a film that is used in the art may be used without limitation. For example, a polyimide-based film may be used. The adhesive layer of the protective film may be formed using an adhesive known in the art, without limitation. For example, the adhesive layer may be formed using a silicone-based adhesive. More specifically, the protective film, the metal mask and the substrate to be etched are sequentially formed, and then the substrate to be etched is subjected to first plasma etching to form a first pattern. In addition, the protective film may be cut to form a pattern. Specifically, the pattern of the protective film may be a curved or linear pattern. More specifically, when a protective film having a curved pattern is provided, the substrate may have a curved first pattern or second pattern, even when the pattern of the metal mask is rectangular in shape. In addition, when only a portion of the metal mask is etched and the protective film corresponding to an area excluding the portion of the metal mask is integrally formed and used, it is possible to adjust the etching area and shape of the substrate to be etched.

Hereinafter, the present invention will be described in detail with reference to examples in order to explain the present invention in detail. However, the examples according to the present invention may be modified into various different forms, and the scope of the present invention is not interpreted as being limited to the examples described below. The examples of the present specification are provided to more completely explain the present invention to those skilled in the art.

Example 1

A Faraday cage was prepared in which the sheet resistance of a mesh portion of the cage was 0.5605 Ω/sq and the bottom of the cage was a stainless steel (SUS304) plate. In addition, the Faraday cage was placed in an inductively coupled plasma-reactive ion etching (ICP-RIE) system (Oxford PlasmaLab System 100).

Al was deposited on a 1 mm-thick quartz substrate to form an Al layer having a thickness of about 50 nm. Thereafter, photoresist was spin-coated on the Al layer, and then the photoresist was developed by UV irradiation using a photomask having a pitch of 405 nm. Next, the Al layer was selectively etched to form an Al metal mask having a pattern with a pitch of 405 nm and a width of 200 nm on the quartz substrate, and then the photoresist layer was removed, thereby preparing a substrate to be etched.

Thereafter, a support having a height of 30 mm and made of Al was provided in the Faraday cage, and the quartz substrate was placed on the support. At this time, the minimum distance between one surface of the quartz substrate and the mesh portion was about 7 mm.

Then, first plasma etching was performed using an ICP-RIE system (Oxford PlasmaLab System 100) for 30 seconds to form a first pattern portion on the substrate. At this time, as a reactive gas, a 2:45 mixture of $O_2$ and $C_4F_8$ was supplied at a flow rate of 47 sccm. In addition, as etching conditions, the ICP power which is the output of the plasma etching system was set to 2500 W, the electrode power was set to 230 W, the operating pressure was set to 7 mTorr, and the etching temperature was set to 20° C.

Thereafter, the metal mask was removed from the substrate having the first pattern formed on a surface thereof, and the substrate was placed on the support having an inclination angle of 40°. Then, a second plasma etching was performed for 180 seconds under the same conditions as the first plasma etching to form a second pattern on the substrate.

Example 2

A second pattern was formed on a substrate in the same manner as in Example 1, except that the first plasma etching was performed for 60 seconds.

Comparative Example 1

First plasma etching was performed in the same manner as in Example 1, and a second pattern was formed on a substrate in the same manner as in Example 1, except that the metal mask was not removed after the first plasma etching was performed.

Comparative Example 2

First plasma etching was performed in the same manner as in Example 1, except that the first plasma etching was performed for 60 seconds. In addition, a second pattern was formed on a substrate in the same manner as in Example 1, except that the metal mask was not removed after the first plasma etching was performed.

Comparative Example 3

First plasma etching was performed in the same manner as in Example 1, except that the first plasma etching was performed for 90 seconds. In addition, a second pattern was formed on a substrate in the same manner as in Example 1, except that the metal mask was not removed after the first plasma etching was performed.

Morphological Analysis of Substrate

Figure 6:
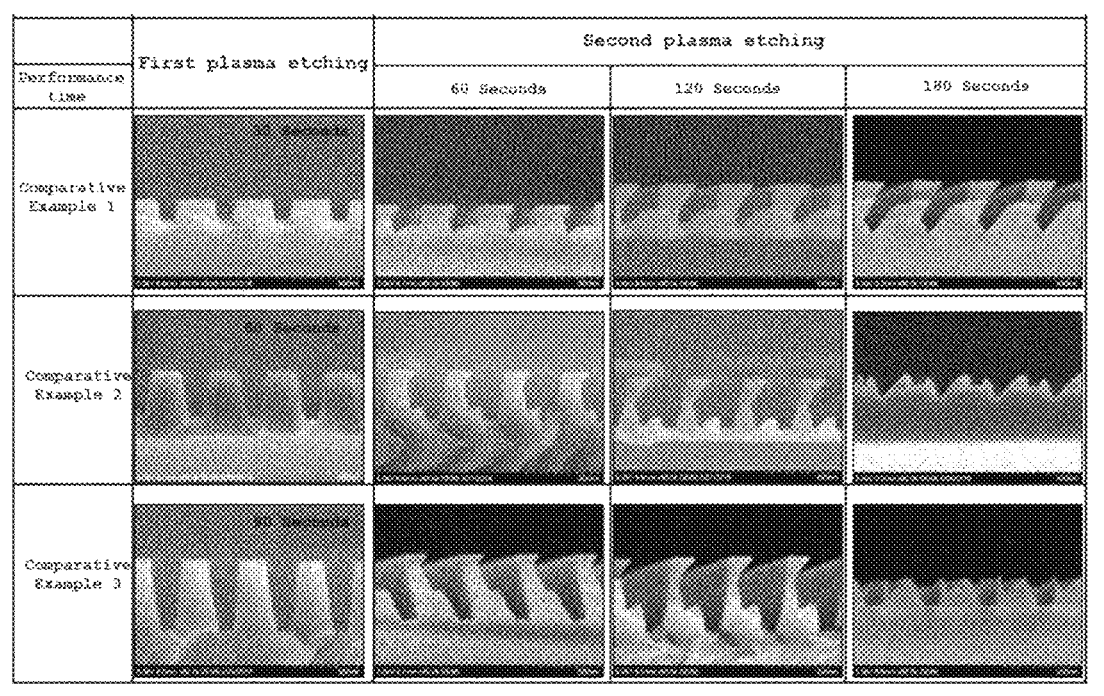

FIG. 5 shows scanning electron micrographs of sections of the substrates, each including the second pattern produced in Examples 1 and 2 of the present invention. In addition, FIG. 6 shows scanning electron micrographs of sections of the substrates, each including the second pattern produced in Comparative Examples 1 to 3.

As shown in FIG. 5, in Examples 1 and 2 of the present invention, the second pattern having a blazed grating was precisely formed on a surface of the substrate within 180 seconds after the second plasma etching was performed. In addition, it was confirmed that the depth of the first pattern varied depending on the time for performing the first plasma etching, and the blazed grating of the second pattern portion varied depending on the time for performing the second plasma etching.

On the other hand, in Comparative Examples 1 to 3, in which the second plasma etching was performed without removing the metal mask after the first plasma etching was performed, the second pattern n having a blazed grating was not formed.

In addition, the depth and pitch of the first pattern formed on a surface of the substrate in each of Examples 1 and 2 were measured, and the depth and oblique inclination angle of the second pattern were measured. The results of the measurement are shown in Table 1 below.

TABLE 1

|  | First pattern portion | | Second pattern portion | |
| --- | --- | --- | --- | --- |
|  | Depth (nm) | Pitch (nm) | Depth (nm) | Oblique inclination angle (°) |
| Example 1 | 150 | 405 | 180 | 37 |
| Example 2 | 330 | 405 | 210 | 38 |

Referring to Table 1 above, as the depth and pitch of the first pattern is controlled, it is possible to control the depth and oblique inclination angle of the second pattern.

Simulation of Light Diffraction Efficiency of Substrate

For a substrate having, on a surface thereof, a second pattern having a blazed grating, which can be produced according to one embodiment of the present invention, and a substrate having, on a surface thereof, a first pattern having a flat end shape, simulation was performed using a Fourier modal method, and the light diffraction efficiencies of the substrates were calculated using the simulation.

Reference Example 1

A substrate to be etched including a second pattern having a blazed grating was set as Reference Example 1. Specifically, the blazed grating of the second pattern of the substrate had a pitch of 405 nm, a depth of 220 nm and an oblique inclination angle of 35°, and the light diffraction efficiency of the substrate was calculated using a Fourier modal method.

Reference Examples 2 to 4

Substrates having, on a surface thereof, a first pattern having a flat vertical end shape as shown in FIG. 3 were set as Reference Examples 2 to 4. Specifically, in Reference Example 2, the duty of the first pattern was 0.45, and in Reference Example 3, the duty of the first pattern was 0.55, and in Reference Example 4, the duty of the first pattern was 0.65. In Reference Examples 2 to 4, the depth of the first pattern was changed within the range of 100 nm to 350 nm, and the light diffraction efficiencies of the substrates were calculated using the Fourier modal method.

FIG. 7 schematically illustrates the movement of light incident on the pattern portion of each of the substrates of Reference Examples 1 to 4 of the present invention.

As illustrated in FIG. 7, Inc denotes light which is incident on the pattern at an angle of 0°; To denotes light transmitted after being incident on the pattern; $T_1$ and $T_{-1}$ denote light diffracted by the pattern; and the diffraction angles of $T_1$ and $T_{-1}$ are identical to each other.

FIGS. 8A and 8B are graphical representation of the light diffraction efficiencies calculated, using the Fourier modal method, for the substrates of Reference Examples 1 to 4 of the present invention. Specifically, FIG. 8(A) is a graphical representation of the light diffraction efficiency of the pattern portion on each of the substrates of Reference Examples 1 to 4 for $T_0$, and FIG. 8(B) is a graphical representation of the light diffraction efficiency of the pattern portion on each of the substrates of Reference Examples 1 to 4 for $T_1$.

As shown in FIGS. 8A and 8B, the transmittance of light incident on the substrate according to Reference Example 1, which has, on a surface thereof, the second pattern having a blazed grating, was lower than the transmittance of light incident on each of the substrates having the first pattern according to Reference Examples 2 to 4. In addition, the efficiency with which the light $T_1$ was diffracted by the pattern of the substrate according to Reference Example 1 was superior to the efficiency with which the light was diffracted by the pattern of each of the substrates according to Reference Examples 2 to 4.

Therefore, it can be seen that the substrate to be etched provided with the second pattern having a blazed grating according to one embodiment of the present invention can provide a mold capable of producing a diffraction light guide plate having excellent light diffraction efficiency.

DESCRIPTION OF REFERENCE NUMERALS USED HEREIN

10: Faraday cage
20: Mesh portion
30: Support
100: Substrate to be etched
200: Metal layer
210: Metal mask
300: Photoresist layer

The invention claimed is:

1. A plasma etching method using a Faraday cage, the method comprising the steps of:
   forming a metal mask on a surface of a substrate, wherein the metal mask comprises a pattern exposing a portion of the surface of the substrate;
   performing a first plasma etching on the surface of the substrate to form a first pattern on the portion of the surface of the substrate exposed through the metal mask; and
   removing the metal mask from the surface of the substrate,
   placing the substrate in the Faraday cage, wherein the Faraday case has a mesh portion at a top thereof in such a manner that the surface of the substrate is inclined with respect to a bottom of the Faraday cage,
   performing a second plasma etching to convert the first pattern into a second pattern to form a blazed grating, wherein the mesh portion has a sheet resistance of 0.5 Ω/sq or higher.

2. The plasma etching method of claim 1, wherein a shape of the second pattern is controlled by controlling at least one of a depth of the first pattern and a time for performing the second plasma etching.

3. The plasma etching method of claim 1, wherein the first pattern portion has a depth of 50 nm to 350 nm.

4. The plasma etching method of claim 1, wherein the first pattern portion has a pitch of 300 nm to 550 nm.

5. The plasma etching method of claim 1, wherein a time for performing the second plasma etching is 30 seconds to 180 seconds at an etching rate of 30 nm/min or more.

6. The plasma etching method of claim 5, wherein the etching rate is 30 nm/min or more and less than 100 nm/min.

7. The plasma etching method of claim 1, wherein an output of a plasma etching system during the first plasma etching and the second plasma etching is from 0.75 kW to 4 kW.

8. The plasma etching method of claim 1, wherein the first plasma etching and the second plasma etching comprise supplying a mixed gas comprising a reactive gas and oxygen gas to a plasma etching system at a flow rate of 10 sccm to 100 sccm.

9. The plasma etching method of claim 1, wherein the substrate comprising the second pattern is a mold substrate for a diffraction grating light guide plate.

10. The plasma etching method of claim 1, wherein the second pattern has a depth of 100 nm to 300 nm.

11. The plasma etching method of claim 1, wherein the mesh portion has a sheet resistance of 0.5 Ω/sq to 100 Ω/sq.

* * * * *